United States Patent [15] 3,693,060

Joyce [45] Sept. 19, 1972

[54] SOLID-STATE RELAY USING LIGHT-EMITTING DIODES

[72] Inventor: Michael F. Joyce, Chicago, Ill.

[73] Assignee: North American Philips Corporation, New York, N.Y.

[22] Filed: April 13, 1971

[21] Appl. No.: 133,516

[52] U.S. Cl. ........317/262 R, 250/211 J, 250/217 SS, 307/117, 307/278, 307/252 T, 317/124

[51] Int. Cl. ........................................H01l 15/06

[58] Field of Search...323/21, 16; 250/211 J, 217 SS; 307/278, 284, 311, 117, 252 T; 318/480; 317/235

[56] References Cited

UNITED STATES PATENTS

| | | | |
|---|---|---|---|
| 3,496,390 | 2/1970 | Fischer | 317/235 R |
| 3,309,587 | 3/1967 | Meng | 318/480 X |
| 3,599,000 | 8/1971 | Yanai | 250/217 SS X |
| 3,524,986 | 8/1970 | Harnden | 250/217 SS X |
| 3,370,174 | 2/1968 | Toussaint | 307/278 X |
| 3,577,063 | 5/1971 | Hurd | 323/16 |
| 3,486,821 | 12/1969 | Westhaver | 307/311 X |
| 3,223,911 | 12/1965 | Seiler et al. | 302/252 T |
| 3,459,944 | 8/1969 | Triebwasser | 250/211 J |
| 3,453,450 | 7/1969 | Evalds | 307/252 T X |
| 3,344,310 | 9/1967 | Nuckolls | 307/252 T X |

FOREIGN PATENTS OR APPLICATIONS

| | | | |
|---|---|---|---|
| 240,736 | 9/1962 | Australia | 323/75 F |

OTHER PUBLICATIONS

SCR Manual (GE) 4th Edition, 1967, pp. 294– 295

*Primary Examiner*—J. D. Miller
*Assistant Examiner*—Harry E. Moose, Jr.
*Attorney*—Frank R. Trifari

[57] ABSTRACT

A solid-state relay utilizing a light-emitting diode to transmit optical energy steadily to a photo-sensitive solid-state device to control the conductivity of solid-state elements. A relatively low power source of AC or DC can be used to operate photo-sensitive uni-junction transistor or a pair of light-activated silicon-controlled rectifiers.

1 Claim, 2 Drawing Figures

INVENTOR.
MICHAEL JOYCE
BY
Donald P. Gillette
ATTORNEY

SOLID-STATE RELAY USING LIGHT-EMITTING DIODES

FIELD OF THE INVENTION

This invention relates to solid-state relays and particularly to relays that require absolute isolation of the lower power input section from the section that carries relatively large currents.

BACKGROUND OF THE INVENTION

In my copending application, Ser. No. 32,794, filed Apr. 29, 1970, I disclosed a number of solid-state relay configurations utilizing impulse generating circuits in the low power section, i. e., the section that corresponds to the coil of an ordinary electromagentic relay. Energy was transmitted to another section of these solid-state relays, a section equivalent to the contacts of an ordinary relay. This contact section included solid-state elements capable of handling relatively large amounts of current but sensitive enough to be switched from the non-conductive state to the conductive state by the minute amounts of pulsating power supplied by the oscillation generator in the coil section. The power could be transmitted by pulse transformers or by optical elements or by piezoelectric means but in any case the power was transmitted in the form of pulses of energy rather than in a continuous form.

One of the limitations of the pulse type of transmission is that the repetition rate of the pulses must be so high that the solid-state current-carrying section is rendered conductive virtually as soon as the alternating voltage applied across their current carrying electrodes is of the proper polarity. The higher the repetition rate of the pulses, the more likely the solid-state section is to become conductive as soon as the alternating voltage reaches right polarity. However, in any case, there was always the possibility of a finite delay that could vary from one operation to the next by an amount equal to the time between successive pulses.

It is one of the objects of the present invention to provide a solid-state relay in which the energy that causes the current carrying means to become conductive is transmitted continuously so that the current carrying elements will become conductive at the instant that the voltage applied across them is of the proper polarity.

BRIEF STATEMENT OF THE INVENTION

The solid-state relay of the present invention includes a light-emitting diode (LED) in series with a constant current source to limit the current therethrough. The constant current source may include a rectifier so that the applied current to turn on the LED may be either AC or DC.

Light, or some other electromagnetic radiation, is emitted by the LED from the instant it is energized, and this radiation is transmitted to a photo-sensitive solid state device, such as a uni-junction transistor. The latter can be connected between the gate electrodes of two silicon-controlled-rectifiers (SCR's) which have their anodes and cathodes connected in parallel but not opposite polarity. The anodes and cathodes of the SCR's are connected across current carrying terminals to be connected in series with the source of current and a load through which the current is to be controlled by the relay. Immediately upon energization of the LED, the photo-sensitive transistor causes the SCR's to conduct and whichever one of the SCR's is properly polarized with respect to the alternating current from the power source at that instant will become conductive and allow current to flow through the load. When the alternating current reverses polarity the other SCR immediately becomes conductive to carry current through the load.

It is possible to dispense with the photo-sensitive unijunction transistor by using light activated SCR's (LASCR) and placing them so that they receive radiation directly from the LED.

BRIEF DESCRIPTION OF THE DRAWINGS

The relay of the present invention will be described in greater detail in the following specification together with the drawings in which.

DETAILED DESCRIPTION OF THE INVENTION

Figure 1:
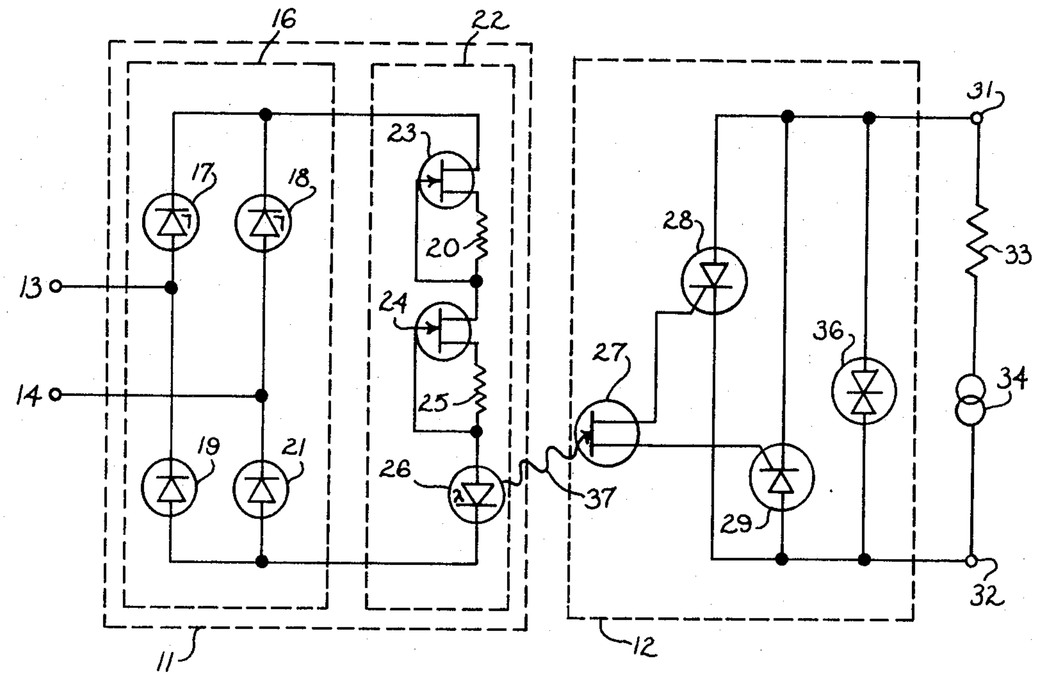
FIG. 1 is a schematic diagram of one embodiment of a solid-state relay according to the present invention.

The circuit in FIG. 1 comprises a first section 11 that takes the place of the coil of a regular relay and a second section 12 that takes the place of single-pole, single-throw contacts of the relay. The first section has input terminals 13 and 14 to which an actuating voltage, either DC or AC, may be applied. For DC operation the actuating voltage may be obtained from a source capable of supplying a voltage having a value between about 3 volts and 200 volts. For AC operation, the actuating voltage may have an amplitude between about 3 volts and 140 volts and any frequency up to about 80 KHz. These values of voltage and frequency are only illustrative of the wide range of operating parameters of working embodiments of the circuit in FIG. 1 and are not to be viewed as limitations of the invention. The terminals 13 and 14 are shown connected to a rectifier circuit 16, although for fixed frequency operation or for operation on DC, no rectifier circuit is required. The rectifier circuit in the present embodiment is a full-wave bridge rectifier comprising two zener diode voltage surge-limiters 17 and 18 and two regular diodes 19 and 21 to change AC actuating signals applied to the terminals 13 and 14 to a rectifier voltage.

One of the main advantages of the present invention is that the relay is actuated as soon as the voltage applied to the input terminals exceeds a threshold value, which, for circuits actually built, has been found to be about 3 volts. Moreover, the relay ceases to be actuated as soon as the applied voltage drops below the threshold value.

The rectified output voltage across the diodes 18 and 21 (or 17 and 19) is connected to the ends of a series circuit comprising an impedance 22, which in the present instance is made up of two field-effect transistors 23 and 24, or FET's, as they are usually called, and a light-emitting diode (LED) 26. Each FET has a substantially constant-current characteristic over a relatively wide range of voltage, and by using two similar FET's in series, the total range is nearly doubled. The current through the FET's is controlled by the values of two resistors 20 and 25 connected in series with the FET's 23 and 24. The FET's may be operated either in the enhancement mode or the depletion mode. If the former, increasing the resistance of the resistors 20 and 25 reduces current through the FET's; if the latter, increasing the resistance of the resistors 20 and 25 increases the current. FET's may also be used with the resistors 20 and 25 included as part of the inherent resistance of the devices.

The contact portion 12 of the circuit in FIG. 1 comprises a photo-sensitive FET 27 connected to the gate electrodes of two silicon-controlled-rectifiers (SCR's) 28 and 29. The SCR's are connected in inverse polarity and in parallel between a pair of terminals 31 and 32 which are equivalent to the contact terminals of the solid-state relay, and a load 33 and main current source 34 are connected to the terminals 31 and 32. A double anode zener diode 36 is connected as a protective device in parallel with the SCR's 28 and 29.

In operation, an actuating voltage applied to the terminals 13 and 14 is rectified by the rectifier 16, if it is an alternating voltage, so that the junction between the diodes 17 and 18 and the FET 23 is positive with respect to the junction between the diodes 19 and 21 and the LED 26. If the actuating voltage is a direct voltage, it must be applied so as to make the junction between the diodes 17 and 18 positive with respect to the junction between the diodes 19 and 21 and the LED 26. The magnitude of a direct voltage would be expected to remain constant, but the instantaneous magnitude of a rectified alternating voltage would vary from instant to instant. However, in either case the FETs 23 and 24 permit only a substantially constant current to flow through to the LED 26.

The current flowing through the LED 26 causes light, or at least electro-magnetic wave energy, to be emitted by the LED. The LED 26 has very fast response and the emission of light begins as soon as voltage is applied to the terminals 13 and 14. This emission, which is indicated by the wavy arrow 37, strikes the photo-sensitive gate of the photo-sensitive FET 27 and causes conduction between its source and drain electrodes. This connects the gates of the SCR's 28 and 29 directly together and causes them to be in a state suitable for conduction as soon as the polarity of voltage from the source 34 as applied to the terminals 31 and 32 is correct. As a result, for one half of each cycle of the alternating voltage from the source 34, the SCR 28 conducts and for the other half-cycle the SCR 29 conducts.

Because of the instantaneous response of the LED 26, there is virtually no delay between the application of the actuating voltage to the terminals 13 and 14 and the closing of the circuit through the load 33. Furthermore, because the light emitted by the LED 26 is continuous rather than being in the form of pulses as in my prior application referred to hereinabove, there is no loss of conductivity at the beginning of each half-cycle of alternating voltage from the source 34. The bi-lateral zener diode 36 is, in effect, a switch that can act as a short circuit in parallel with the SCR's 28 and 29 if the maximum voltage of the source 34 exceeds a pre-determined amount.

Figure 2:
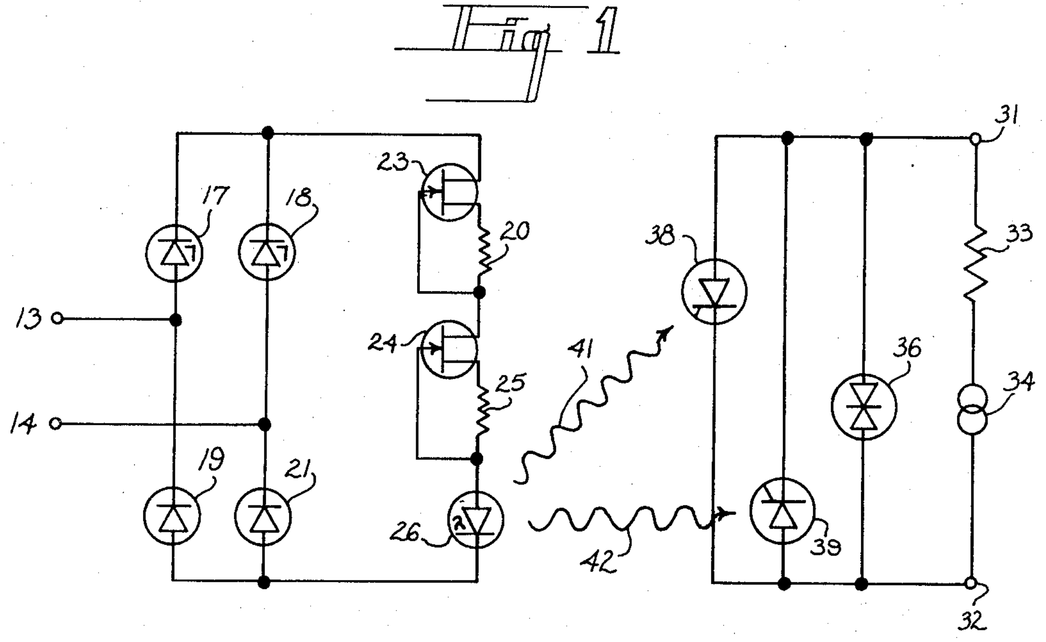
FIG. 2 is a schematic diagram of a solid-state relay according to the present invention.

FIG. 2 shows a modification of the invention that includes many of the same parts as FIG. 1. These parts are identified by the same reference numerals in both figures. Instead of the single photo-sensitive FET of FIG. 1, the circuit of FIG. 2 includes two light-activated silicon-controlled rectifiers 38 and 39.

The operation of the coil section of the relay in FIG. 2 from the input terminals 13 and 14 to the light-emitting diode 26 is the same as in the circuit in FIG. 1. As soon as a voltage of the proper amplitude (and of the proper polarity if it is a direct voltage) is applied to the terminals 13 and 14 it causes the LED 26 to emit radiation indicated by the wavy arrows 41 and 42. This emission strikes the photo-sensitive gate of the light-activated silicon-controlled rectifiers 38 and 39 and places both of the latter solid-state components in a condition to be conductive as soon as a voltage of the proper polarity is applied across their respective anode and cathode electrodes from the source 34. As in the circuit in FIG. 1, the fact that the LED 26 emits radiation continuously, rather than in the form of pulses, means that there is no delay in conductivity of the appropriate light-activated silicon-controlled rectifiers 38 and 39 when the alternating voltage applied by the source 34 changes its polarity.

What is claimed is:

1. A fast response AC or DC solid state relay comprising:

A. A pair of input terminals;

B. A "coil" section comprising:

a diode bridge arrangement having an input and an output, said input of said bridge being connected to said input terminals;

at least one field effect transistor connected as a constant current element; and a light emitting diode forming a series circuit with said field effect transistor, said circuit being connected to the output of said bridge arrangement, said light emitting diode for emitting light continuously when a current of the appropriate polarity and magnitude passes through it;

C. A pair of output terminals;

D. A "contact" section being connected between said output terminals and comprising:

first and second silicon-controlled rectifiers, each having an anode, a cathode, and a gate electrode, the anode of said first silicon-controlled rectifier being connected to the cathode of said second silicon-controlled rectifier and the anode of said second silicon controlled rectifier being connected to the cathode of said first silicon-controlled rectifier; and a photo sensitive field-effect transistor, said transistor having source and drain electrodes and a photo sensitive gate, said source electrode being connected to the gate of said first silicon-controlled rectifier and said drain electrode being connected to the gate of said second silicon-controlled rectifier so as to cause said silicon-controlled rectifiers to be in a conductive state in response to light emitted by said light emitting diode.

* * * * *